(12) United States Patent
Chen et al.

(10) Patent No.: US 7,348,851 B2
(45) Date of Patent: Mar. 25, 2008

(54) MILLER-COMPENSATED AMPLIFIER

(75) Inventors: Hung-I Chen, Kaohsiung (TW); Chih-Hong Lou, Jiaosi Township, Yilan County (TW)

(73) Assignee: Mediatek, Inc., Hsin-Chu (TW)

( * ) Notice: Subject to any disclaimer, the term of this patent is extended or adjusted under 35 U.S.C. 154(b) by 189 days.

(21) Appl. No.: 11/176,177

(22) Filed: Jul. 7, 2005

(65) Prior Publication Data

US 2007/0008036 A1    Jan. 11, 2007

(51) Int. Cl.
*H03F 1/14*  (2006.01)
*H03F 3/45*  (2006.01)

(52) U.S. Cl. ...................................... 330/292; 330/260

(58) Field of Classification Search ................ 330/292, 330/76
See application file for complete search history.

(56) References Cited

U.S. PATENT DOCUMENTS

| | | | |
|---|---|---|---|
| 5,563,501 A | 10/1996 | Chan | 323/282 |
| 5,581,212 A * | 12/1996 | Huang et al. | 330/253 |
| 6,084,475 A | 7/2000 | Rincon-Mora | 330/255 |
| 6,100,762 A * | 8/2000 | Kato | 330/255 |
| 6,304,131 B1 | 10/2001 | Huggins et al. | 327/538 |
| 6,771,126 B2 * | 8/2004 | Blankenship et al. | 330/257 |
| 6,812,778 B1 | 11/2004 | Yeo et al. | 327/541 |
| 6,847,626 B1 | 1/2005 | Carneal et al. | 370/345 |

* cited by examiner

*Primary Examiner*—Robert Pascal
*Assistant Examiner*—Alan Wong
(74) *Attorney, Agent, or Firm*—Thomas, Kayden, Horstemeyer & Risley (57) ABSTRACT

A Miller-compensated amplifier, having an amplifier input and an amplifier output, comprises a first gain stage, a second gain stage, a third gain stage, and a capacitor. The first gain stage has the amplifier input as a first gain stage input thereto and a first gain stage output. The second gain stage has a second gain stage input, coupled to the first gain stage output, and a second gain stage output. The third gain stage has a third gain stage input, coupled to the second gain stage output, and provides an output voltage at the amplifier output. The capacitor is coupled between the amplifier output and the second gain stage input. The second gain stage amplifies a small signal part of a current received thereby and leaves a DC component thereof substantially the same.

22 Claims, 7 Drawing Sheets

MILLER-COMPENSATED AMPLIFIER

BACKGROUND

The invention relates to frequency compensation of electronic circuits and, in particular, to circuits having compensating capacitors.

Stability of circuit feedback is improved by compensating to increase phase margin. A well known technique for improving phase margin takes advantage of Miller Effect, by adding a Miller-compensating capacitor in parallel with a gain stage, e.g., the output stage of a two stage amplifier circuit. Such a configuration results in the well-known and desirable phenomenon of pole splitting, which advantageously multiplies the effective capacitance of the physical capacitor employed in the circuit. Background on compensation of amplifier circuits using Miller-compensating capacitor can be found in Paul R. Gray and Robert G. Meyer, Analysis and Design of Analog Integrated Circuits, Third Ed., John Wiley & Sons, Inc., New York, 1993, Ch. 9, especially pp. 607-623.

Figure 1:
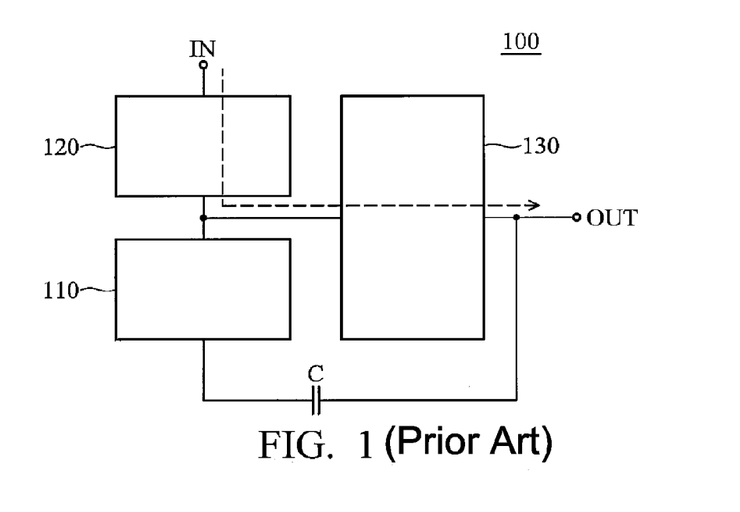
FIG. 1 is a block diagram of a compensated amplifier disclosed in U.S. Pat. No. 6,084,475.

U.S. Pat. No. 6,084,475 discloses a compensated amplifier amplifying an input signal applied to an input node to provide an output signal at an amplifier output node. As shown in FIG. 1, the compensated amplifier 100 comprises a first amplifier stage 110, a second amplifier stage 120, a third amplifier stage 130, and a capacitor C. The first amplifier stage 110 has an internal node as an input thereto and a first stage output node. The second amplifier stage 120 has the amplifier input node as an input thereto and a second stage output node. The third amplifier stage 130 has a third stage input node coupled to the first stage output node and the second stage output node and provides the output signal at the amplifier output node. The capacitor C is coupled between the amplifier output node and the internal node. By connecting the capacitor C in such a way, feedback current through the capacitor C is amplified by the second amplifier stage 120 before reaching a high impedance node. The resulting effective load capacitance at the high impedance node is also amplified. A main signal path of the compensated amplifier is shown as a dashed arrow in FIG. 1. The main signal is received by the second amplifier stage 120 and amplified by the third amplifier stage 130. Nevertheless, a product of gain and bandwidth of the compensated amplifier decrease with amplification of the capacitance.

SUMMARY

An embodiment of a Miller-compensated amplifier, having an amplifier input and an amplifier output, comprises a first gain stage, a second gain stage, a third gain stage, and a capacitor. The first gain stage has the amplifier input as a first gain stage input thereto and a first gain stage output. The second gain stage has a second gain stage input coupled to the first gain stage output, and a second gain stage output. The third gain stage has a third gain stage input coupled to the second gain stage output, and provides an output voltage at the amplifier output. The capacitor is coupled between the amplifier output and the second gain stage input. The second gain stage amplifies a small signal part of a current received thereby by a first gain and amplifies a DC component thereof by a second gain.

Another embodiment of a Miller-compensated amplifier, amplifying a differential input signal to provide an output signal, comprises a differential amplifier, a bias current source, a MOS transistor pair, a first current mirror comprising first and second MOS transistors, a second current mirror comprising third and fourth MOS transistors, fifth and sixth MOS transistors, a third current mirror, a seventh MOS transistor, a current source, and a capacitor. The differential amplifier converts a voltage of the differential input signal to differential output currents at an output pair thereof. The bias current provides a bias current to the differential amplifier. The MOS transistor pair has drains thereof cross-coupled to the output pair. The first and second current mirrors are coupled to the output pair. The first and third MOS transistors are respectively connected in a diode-connected structure. The first and second MOS transistors have a common gate connection node. The third and fourth MOS transistors also have a common gate connection node. The fifth and sixth MOS transistors are respectively cascode-connected to the second and fourth MOS transistors. The third current mirror provides current to the fifth and sixth MOS transistors. The seventh MOS transistors has a gate coupled to one of the fifth and sixth MOS transistors, and a source thereof connected to a voltage source. The current source provides a current to a drain of the seventh MOS transistor. The capacitor is coupled between the drain of the seventh MOS transistor and the common gate connection node of one of the first and second current mirrors.

DETAILED DESCRIPTION

Figure 2:
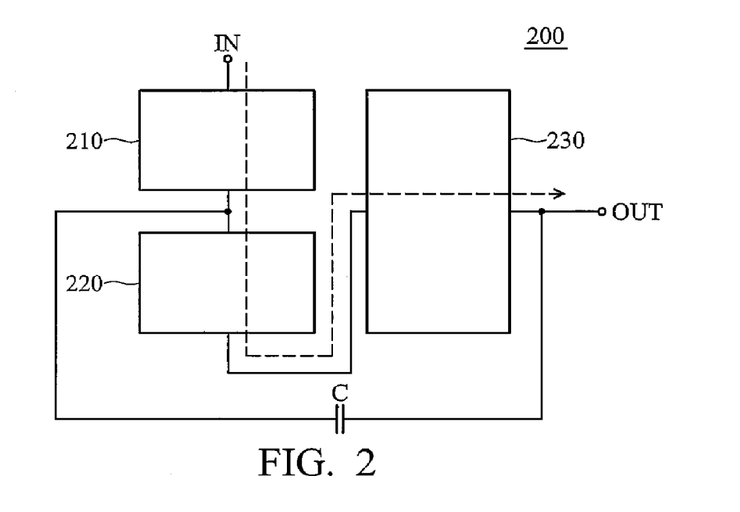
FIG. 2 is a block diagram of a Miller-compensated amplifier according to an embodiment of the invention.

FIG. 2 is a block diagram of a Miller-compensated amplifier according to an embodiment of the invention. The Miller-compensated amplifier 200, having an amplifier input 201 and an amplifier output 203, comprises a first gain stage 210, a second gain stage 220, a third gain stage 230, and a capacitor C. The first gain stage 210 has the amplifier input 201 as a first gain stage input thereto and a first gain stage output 213. The second gain stage 220 has a second gain stage input 221, coupled to the first gain stage output 213, and a second gain stage output 223. The third gain stage 230 has a third gain stage input 231, coupled to the second gain stage output 223, and provides an output voltage at the amplifier output 203. The capacitor C is coupled between the amplifier output 203 and the second gain stage input 221. The second gain stage 220 amplifies a small signal part of a current i received thereby by a first gain and amplifies a DC component thereof by a second gain. Preferably, the first gain exceeds one, while the second gain substantially equals one. A main signal path of the Miller-compensated amplifier is shown as a dashed arrow in FIG. 2. The main signal is received by the first gain stage 210 and transmitted to the second gain stage 220 thereby. Subsequently, the third gain stage 230 receives the main signal from the second gain stage 220 and provides an output signal at the amplifier output.

Figure 3A:
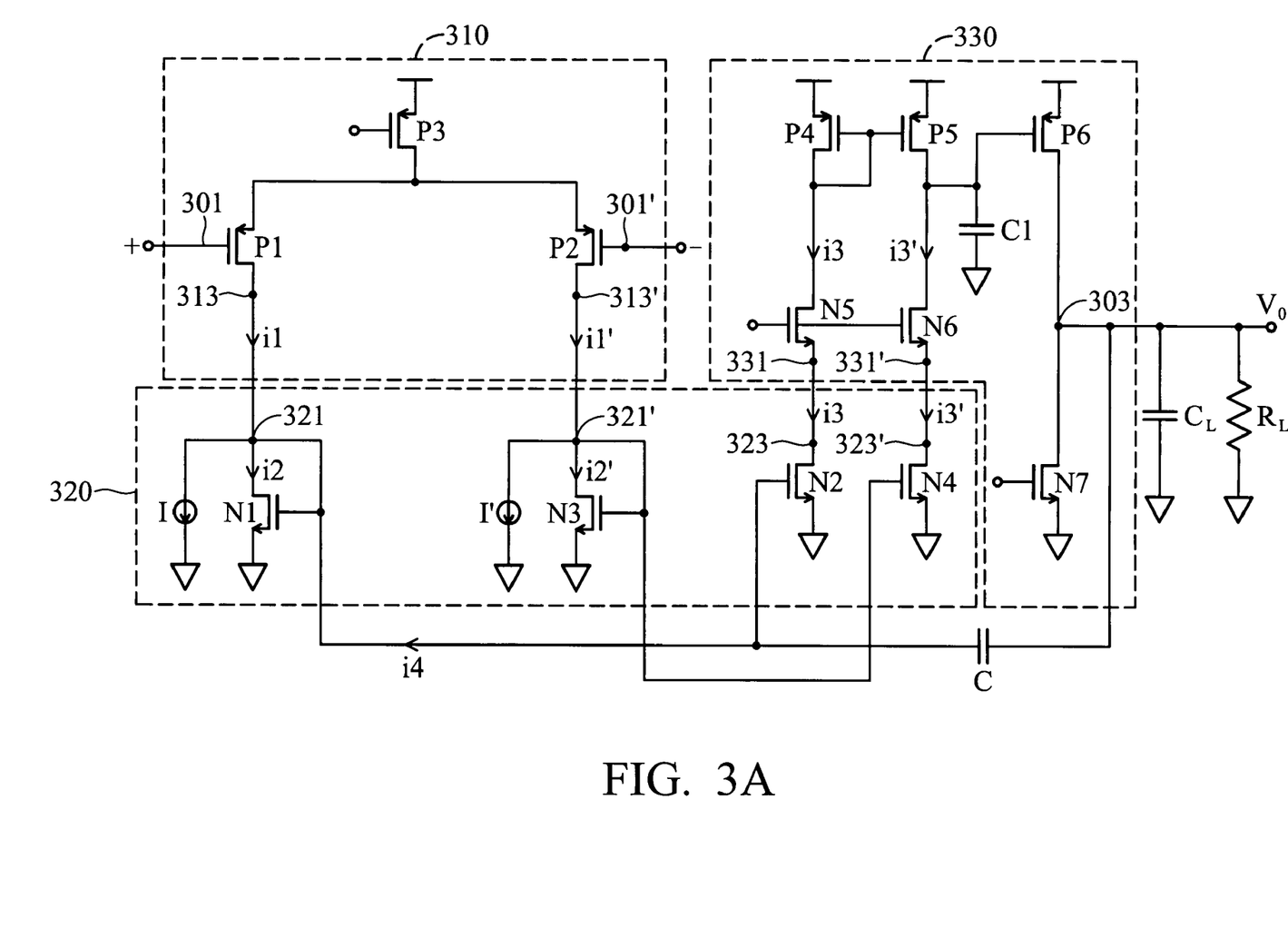
FIG. 3A is a schematic diagram of a Miller-compensated amplifier according to an embodiment of the invention.

FIG. 3A is a schematic diagram of a Miller-compensated amplifier according to an embodiment of the invention. The Miller-compensated amplifier 300, having an amplifier input pair 301 and 301' and an amplifier output 303, comprises a first gain stage 310, a second gain stage 320, a third gain stage 330, and a capacitor C. As shown in FIG. 3A, the first gain stage 310 is a common-source differential amplifier comprising PMOS transistors P1 and P2 and a current source connected to a voltage source. The PMOS transistors P1 and P2 have a common source connection node. The current source is itself a PMOS transistor P3. The source and drain of the PMOS transistor P3 are respectively connected to a voltage source and the common source connection node. The amplifier input pair 301 and 301' is also a first input pair to the first gain stage 310. The first gain stage 310 receives an input voltage pair and converts the input voltage pair to a first current pair $i_1$ and $i_1'$ at a first output pair 313 and 313'.

In FIG. 3A, the second gain stage 320 comprises a current mirror pair comprising first and second current mirrors respectively coupled to one of the first output pair 313 and 313'. The first current mirror comprises NMOS transistors N1 and N2. The second current mirror comprises NMOS transistors N3 and N4. The NMOS transistors N1 and N3 are diode-connected transistors, with drains and gates tied together respectively. The drains of the NMOS transistors N1 and N3 act as a second input pair 321 and 321' connected to the first output pair 313 and 313'. The NMOS transistors N2 and N4 respectively have a common gate connection node with the first and third MOS transistors N1 and N3. A second current pair $i_2$ and $i_2'$ through the NMOS transistors N1 and N3 is mirrored to provide a third current pair $i_3$ and $i_3'$ at drains of the NMOS transistors N2 and N4, regarded as the second output pair 323 and 323'. In addition, the second gain stage 320 can further comprise a current source pair I and I' respectively coupled to the second input pair 321 and 321'. The second gain stage 320 amplifies a small signal part of the second current pair $i_2$ and $i_2'$ by a first gain to form a small signal part of the third current pair $i_3$ and $i_3'$ and a DC component of the second current pair $i_2$ and $i_2'$ by a second gain to form a DC component of the third current pair $i_3$ and $i_3'$. Preferably, the first gain exceeds one, while the second gain substantially equals one.

In FIG. 3A, the third gain stage 330 comprises NMOS transistors N5 and N6, a PMOS transistor P6 and a NMOS transistor N7. NMOS transistors N5 and N6 are cascode-connected to the NMOS transistors N2 and N4, respectively. The third current pair $i_3$ and $i_3'$ through the NMOS transistors N2 and N4 also flows through the NMOS transistors N5 and N6. Sources of the NMOS transistors N5 and N6 are regarded as a third input pair 331 and 331'. A third current mirror is coupled to the drains of the NMOS transistors N5 and N6 and provides current thereto. The third current mirror comprises PMOS transistors P4 and P5 having sources coupled to a voltage source, gates connected to each other, and drains connected to the drains of the NMOS transistors N5 and N6. Alternatively, the third current mirror can also be a cascode current mirror or other kind of current mirror. Sources of the PMOS transistor P6 and the NMOS transistor N7 are respectively connected to a voltage source and a ground. Drains of the PMOS transistor P6 and the NMOS transistor N7 are connected together and act as the amplifier output 303. A gate of the PMOS transistor P6 is coupled to one of the drains of the NMOS transistors N5 and N6. The third gain stage 330 converts the third current pair $i_3$ and $i_3'$ to an output voltage. The capacitor C is coupled between the amplifier output 303 and one of the second gain stage input pair 321 and 321'. In the embodiment, one of the second current pair $i_2$ and $i_2'$ is a sum of one of the first current pair $i_1$ and $i_1'$ and a fourth current $i_4$ ($i_2=i_1+i_4$) and the other of the second current pair $i_2$ and $i_2'$ equals the other of the first current pair $i_1$ and $i_1'$ ($i_2'=i_1'$), wherein the fourth current $i_4$ is through the capacitor C.

A transfer function of the Miller-compensated amplifier shown in FIG. 3A is, $$\frac{v_o}{v_i} = \frac{\frac{1}{2}g_{mP1}g_{mN2}g_{mP6} + \frac{1}{2}g_{mP2}g_{mP6}\frac{g_{mN4}}{g_{mN3}}(g_{mN3} + sC) - \frac{1}{2}g_{mP1}sC\left(\frac{1}{r_{oP5}} + sC_1\right)}{(g_{mN1} + sC)\left(\frac{1}{R_L} + s(C_L + C)\right)\left(\frac{1}{r_{oP5}} + sC_1\right) - s^2C^2\left(\frac{1}{r_{oP5}} + sC_1\right) + sCg_{mN2}g_{mP6}}$$

$g_{mN1}$, $g_{mN2}$, $g_{mN3}$ $g_{mN4}$, $g_{mP1}$, $g_{mP2}$ and $g_{mP6}$ are respectively transconductance of NMOS transistors N1/N2/N3/N4 and PMOS transistors P1/P2/P6. $r_{oP5}$ is an output resistance of the PMOS transistor P5. $C_1$ is a parasitic capacitor at the gate of the PMOS transistor P6. $R_L$ and $C_L$ are respectively a load resistor and a load capacitor connected to the amplifier output 303. From the transfer function, it is known that the Miller-compensated amplifier is a system with three poles and two zeros. Typically, $g_{mN1}$ is designed to equal $g_{mN3}$, and $g_{mN2}$ equal $g_{mN4}$. If the current gain $g_{mN4}/g_{mN3}=K$, the poles and zeros are expressed as, $$p_1 = \frac{1}{Kg_{mP6}R_LCr_{oP5}}$$

$$p_2 \approx \frac{Kg_{mP6}C}{C_1C_L}$$

$$p_3 = \frac{g_{mN1}}{C}$$

$$z_1 = -K\frac{g_{mP6}}{C_1}$$

$$z_2 = 2\frac{g_{mN3}}{C}$$

By merely increasing the factor K in the transfer function, a non-dominant pole $p_2$ and a right handed plane (RHP) zero $z_1$ can be increased, which in turn improves stability of the Miller-compensated amplifier. In addition, since a DC gain $A_{dc}$ is proportional to the factor K and the dominant pole $p_1$ inverse proportional to the factor K, the product of the DC gain $A_{dc}$ and the dominant pole $p_1$ does not change with the factor K. In other words, the gain-bandwidth product is not sacrificed for stability.

Actually, adjusting only the factor K without changing other parameters in the transfer function can be accomplished by modifying $g_{nM1}$, $g_{mN3}$, I, and I'. Reducing $g_{mN1}$ and $g_{mN3}$ increases the factor K. Nevertheless, DC currents through the NMOS transistors N2 and N4 should be kept constant such that small signal parameters related to the MOS transistors N2, N4 and P5 remain the same. As a result, I and I' are increased to keep the DC currents through the NMOS transistors N2 and N4 the same.

Figure 3B:
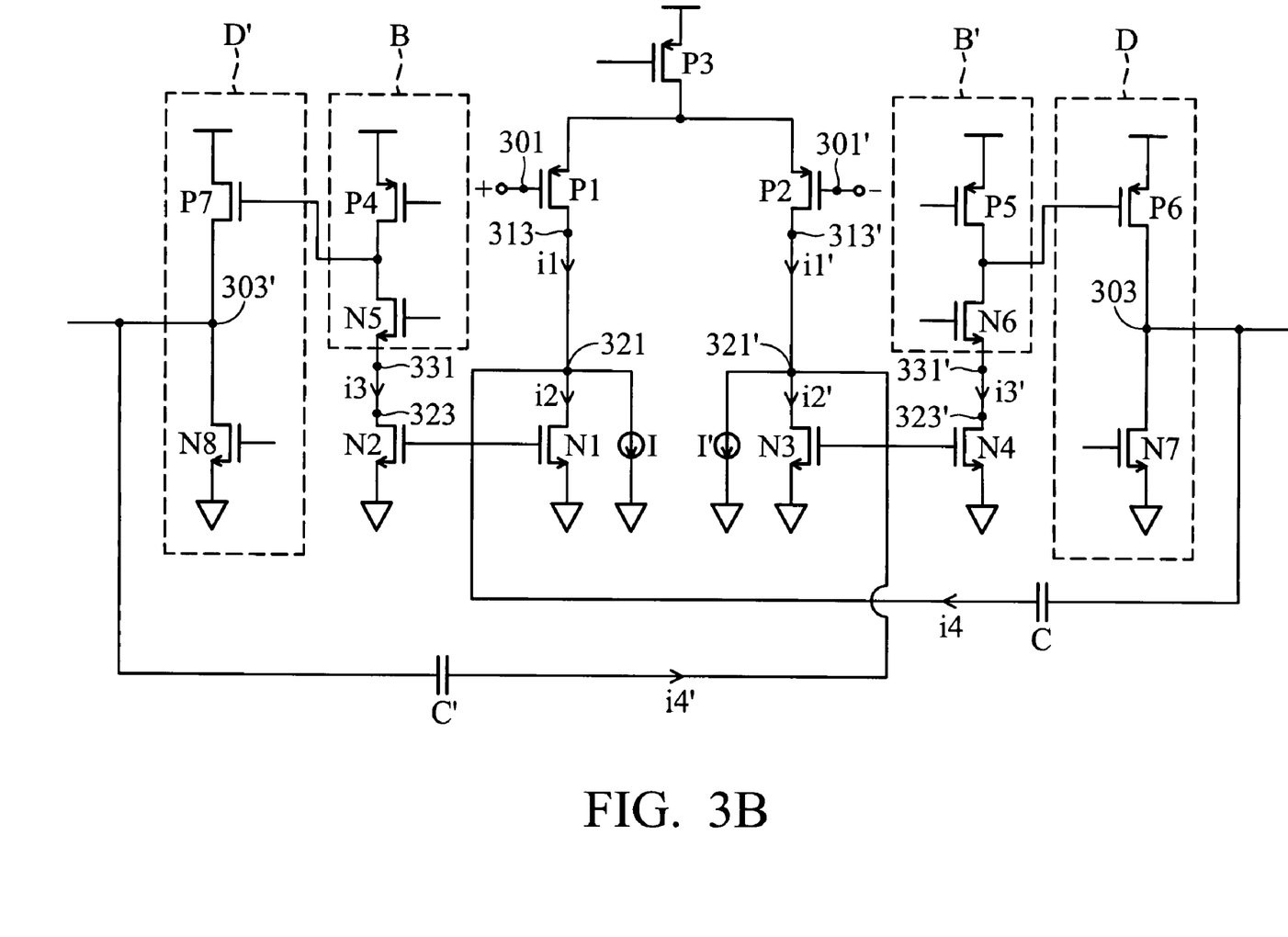
FIG. 3B shows a variation of the Miller-compensated amplifier in FIG. 3A.

FIG. 3B shows a variation of the Miller-compensated amplifier in FIG. 3A, differing in that part of the original third gain stage is divided here into two half circuits B and B', another half circuit D' is added in the third gain stage, and a capacitor C' coupled between the amplifier output 303' and the other of the second gain stage input pair 321 and 321'. The half circuit B comprises an NMOS transistor N5 and a current source coupled thereto. The current source is a PMOS transistor P4 in FIG. 3B. The half circuit B' has the same structure as the half circuit B. A half circuit D, comprising a PMOS transistor P6 and a NMOS transistor N7, is coupled to the drain of the PMOS transistor P5. Sources of the PMOS transistor P6 and the NMOS transistor N7 are respectively connected to a voltage source and a ground. Drains of the PMOS transistor P6 and the NMOS transistor N7 are connected together and act as the amplifier output 303. A gate of the PMOS transistor P6 is coupled to the drain of the PMOS transistor P5. The half circuit D', comprising a PMOS transistor P7 and a NMOS transistor N8, is coupled to the drain of the PMOS transistor P4. Sources of the PMOS transistor P7 and the NMOS transistor N8 are respectively connected to a voltage source and a ground. Drains of the PMOS transistor P7 and the NMOS transistor N8 are connected together and act as the amplifier output 303'. A gate of the PMOS transistor P7 is coupled to the drain of the PMOS transistor P4.

Figure 4A:
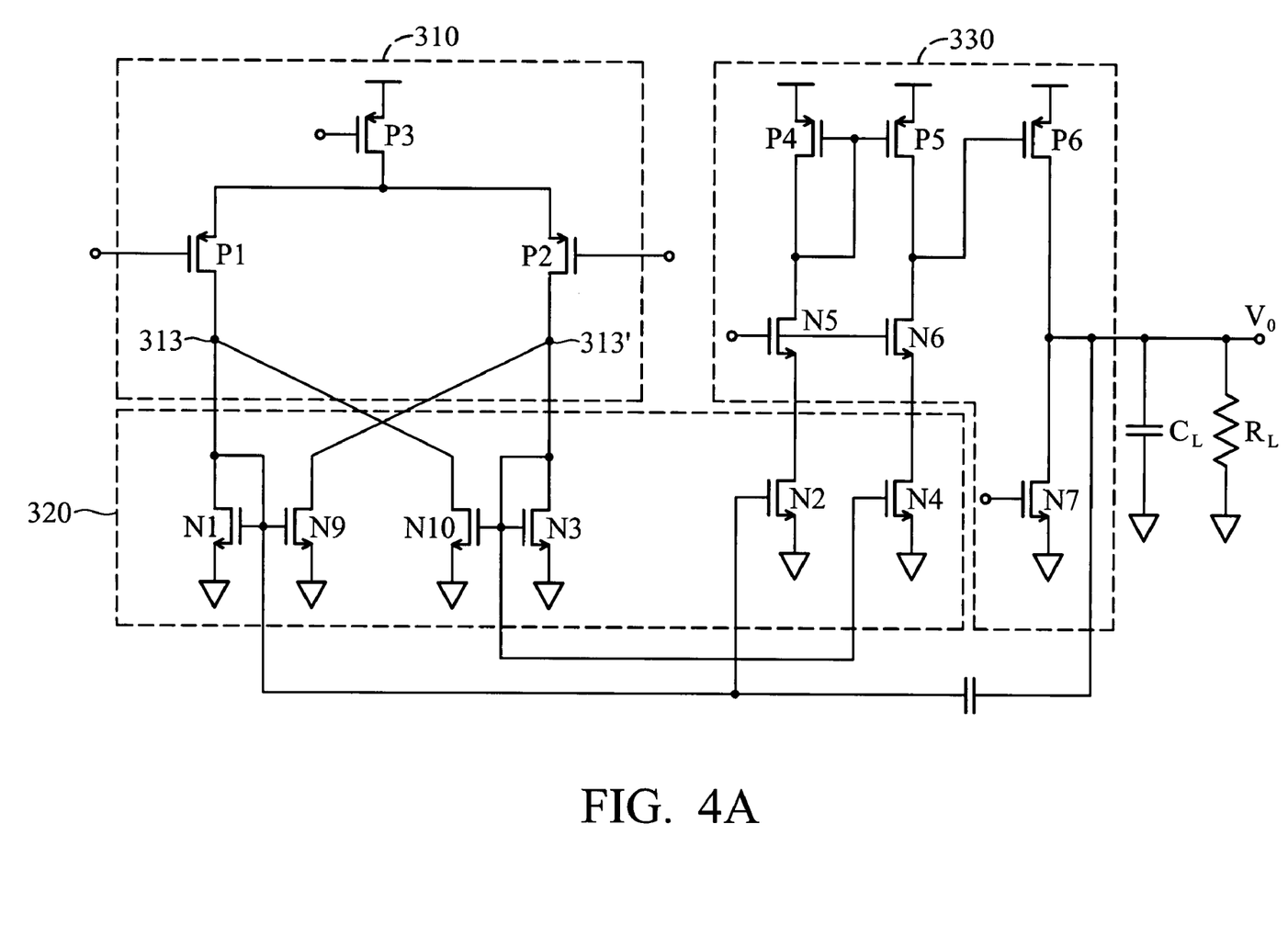
FIG. 4A shows another variation of the Miller-compensated amplifier in FIG. 3A.

FIG. 4A shows another variation of the Miller-compensated amplifier in FIG. 3A, differing in that the current mirror pair I and I' is replaced by a MOS transistor pair N9 and N10. In FIG. 4A, the MOS transistors N9 and N10 are NMOS transistors with drains cross-coupled to the output pair 313 and 313'. The NMOS transistor N2 has a common connection node with the diode-connected NMOS transistor N1 and the NMOS transistor N9. The NMOS transistor N4 has a common connection node with the diode-connected NMOS transistor N3 and the NMOS transistor N10. In this embodiment, a small signal current gain K equals $(g_{mN2}/(g_{mN1}-g_{mN9}))$ and a DC current gain equals $(g_{mN2}/(g_{mN1}+g_{mN9}))$. Thus, changing the value $(g_{mN1}-g_{mN9})$ and keeping $(g_{mN1}+g_{mN9})$ a constant adjusts K to a target value.

Figure 4B:
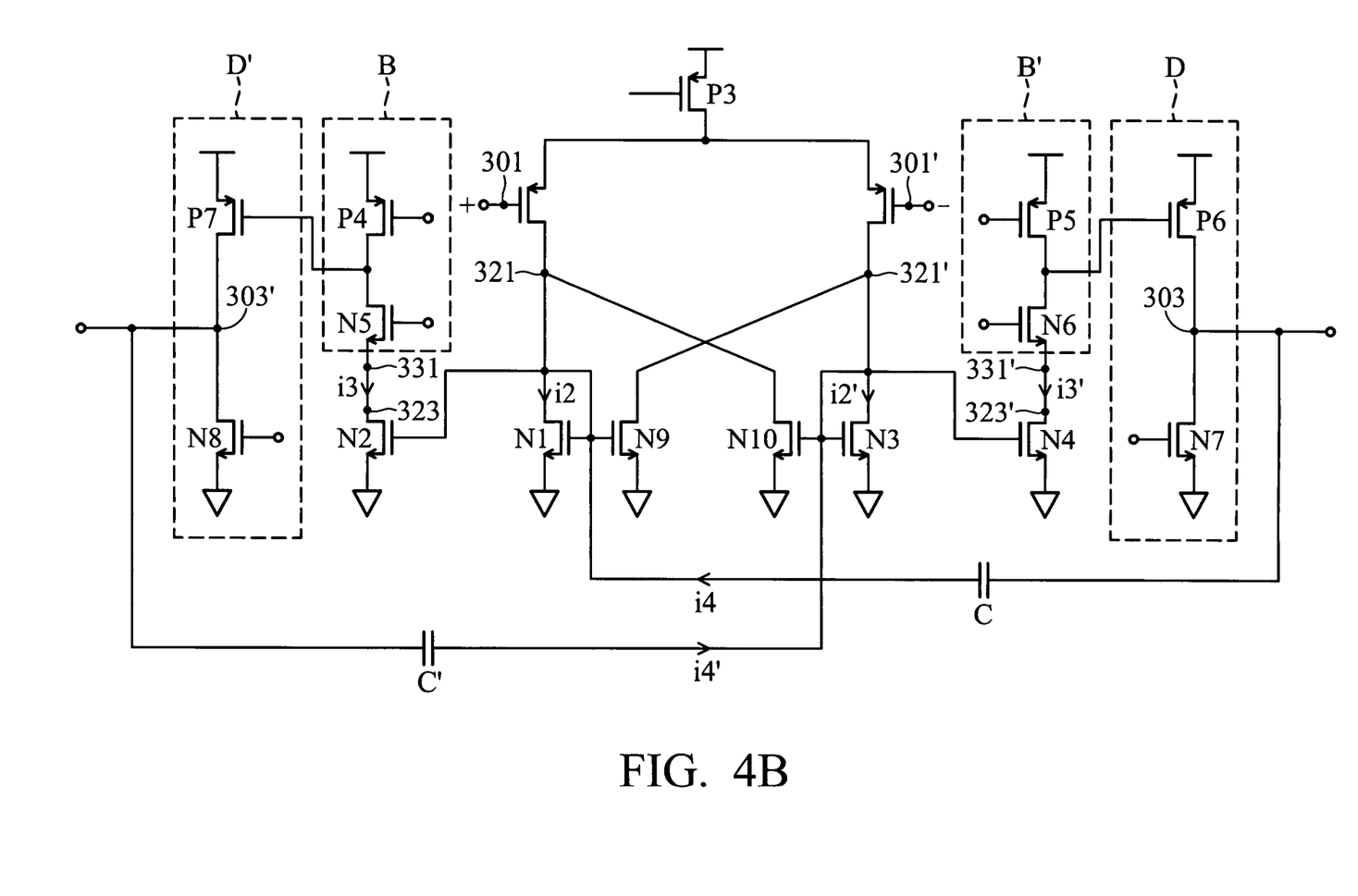
FIG. 4B shows a variation of the Miller-compensated amplifier in FIG. 4A.

FIG. 4B shows a variation of the Miller-compensated amplifier in FIG. 4A, differing in that part of the original third gain stage is divided into two half circuits B and B', another half circuit D' is added in the third gain stage, and a capacitor C' is coupled between the amplifier output 303' and the other of the second gain stage input pair 321 and 321'. The half circuit B comprises an NMOS transistor N5 and a current source coupled thereto. The current source is a PMOS transistor P4 in FIG. 4B. A half circuit D is coupled to the drain of the PMOS transistor P5. The half circuit D' has the same structure as the half circuit D and is coupled to the drain of the PMOS transistor P4.

Figure 5:
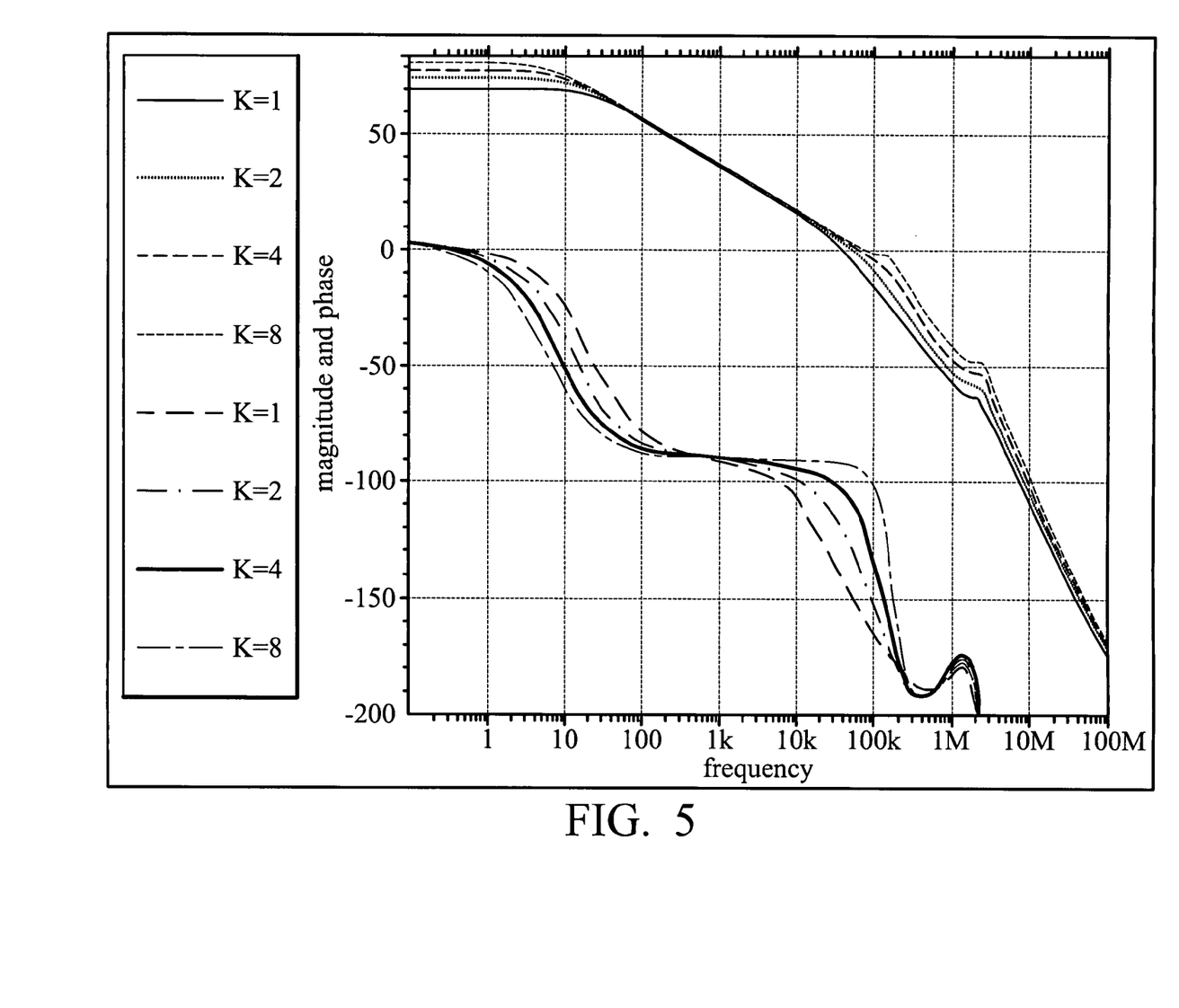
FIG. 5 shows frequency responses of Miller-compensated amplifiers with a factor K of 1, 2, 4, and 8 according to an embodiment of the invention.
Figure 6:
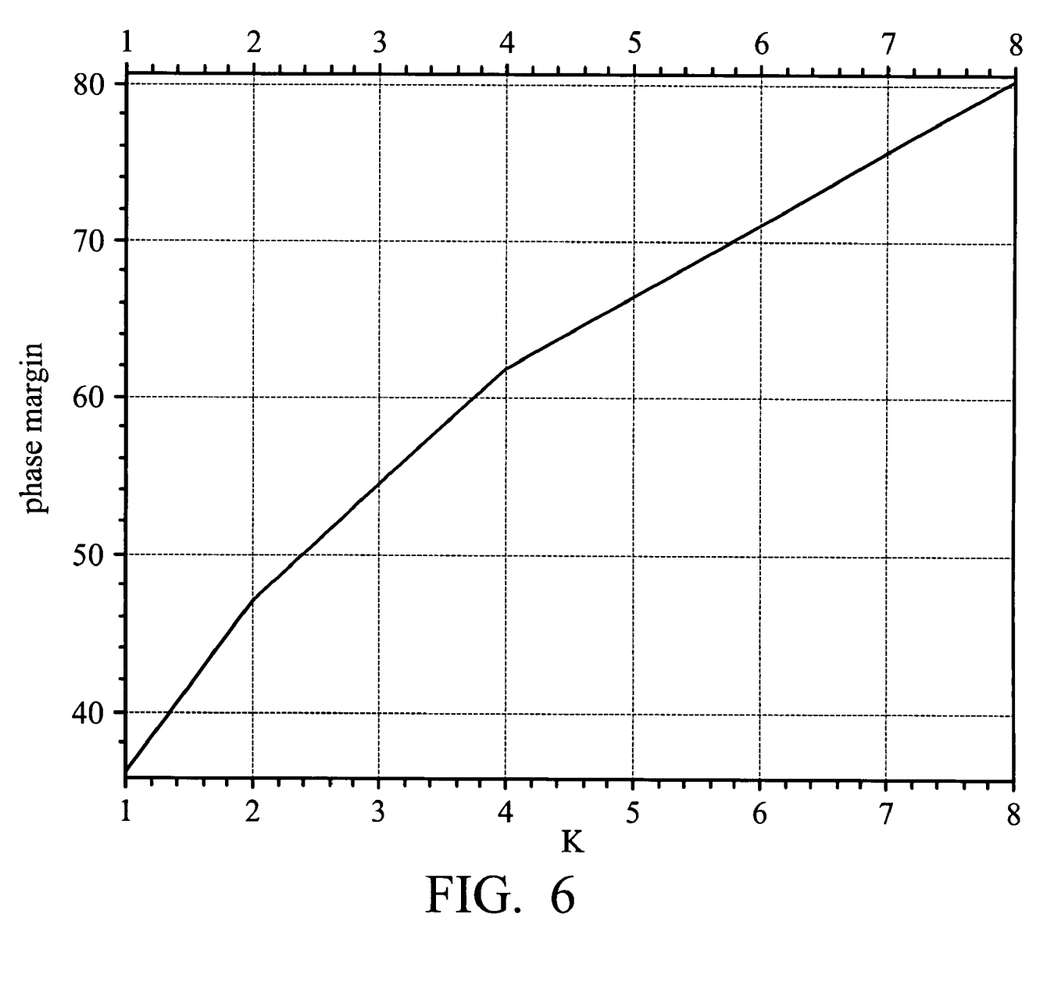
FIG. 6 shows phase margins of Miller-compensated amplifiers with a factor K of 1, 2, 4, and 8 according to an embodiment of the invention.

FIG. 5 shows frequency responses of Miller-compensated amplifiers with a K value of 1, 2, 4, and 8 according to an embodiment of the invention. In FIG. 5, a DC gain increases with the K value. In addition, a product of the DC gain and bandwidth does not change with the K value, which is demonstrated by overlapping of the curves with a slope of −20 dB/decade. In addition, it is also shown that the non-dominant pole increases with the K value. FIG. 6 shows phase margins of Miller-compensated amplifiers with a K value of 1, 2, 4, and 8 according to an embodiment of the invention. In FIG. 6, the phase margin increases with the K value.

While the invention has been described by way of example and in terms of preferred embodiment, it is to be understood that the invention is not limited thereto. To the contrary, it is intended to cover various modifications and would be apparent to those skilled in the art. Therefore, the scope of the appended claims should be accorded the broadest interpretation so as to encompass all such modifications.

What is claimed is:

1. A Miller-compensated amplifier having an amplifier input pair and an amplifier output, comprising:
   a first gain stage having the amplifier input pair as a first input pair, receiving an input voltage pair and a first output pair outputting a first current pair (i1 and i1');
   a second gain stage having a second input pair receiving a second current pair (i2 and i2'), and having a second output pair outputting a third current pair (i3 and i3'), the second gain stage amplifying a small signal part of the second current pair by a first gain to form a small signal part of the third current pair and a DC component of the second current pair by a second gain to form a DC component of the third current pair;
   a third gain stage having a third input pair receiving the third current pair (i3 and i3') and converting the third current pair (i3 and i3') to generate an output voltage at the amplifier output; and
   a capacitor coupled between the amplifier output and one of the second gain stage input pair;
   wherein one of the second current pair is a sum of one of the first current pair and a fourth current (i2=i1+i4) and the other of the second current pair equals to the other of the first current pair (i2'=i1') wherein the fourth current i4 is through the capacitor.

2. The Miller-compensated amplifier of claim 1, wherein the first gain exceeds one.

3. The Miller-compensated amplifier of claim 1, wherein the second gain substantially equals one.

4. The Miller-compensated amplifier of claim 1, wherein the second gain stage further comprises a current source pair coupled to the second input pair.

5. The Miller-compensated amplifier of claim 4, wherein the current source pair sources current from the second gain stage.

6. The Miller-compensated amplifier of claim 4, wherein the current source pair sinks current to the second gain stage.

7. The Miller-compensated amplifier of claim 1, wherein the second gain stage further comprises a MOS transistor pair with drains thereof cross-coupled to the second input pair.

8. The Miller-compensated amplifier of claim 1, wherein the first gain stage comprises:
   a differential amplifier converting the input voltage pair to the first current pair at the first output pair; and
   a first current source providing a bias current to the differential amplifier.

9. The Miller-compensated amplifier of claim 1, wherein the second gain stage comprises:
   a current source pair coupled to the second input pair; and
   first and second current mirrors coupled to the second input pair, the first current mirror comprising a first MOS transistor in a diode-connected structure and a second MOS transistor having a common gate connection node with the first MOS transistor and one of the current source pair, and the second current mirror comprising a third MOS transistor in a diode-connected structure and a fourth MOS transistor having a common gate connection node with the third MOS transistor and the other of the current source pair.

10. The Miller-compensated amplifier of claim 1, wherein the second gain stage comprises:

a MOS transistor pair with drains thereof cross-coupled to the second input pair; and first and second current mirrors coupled to the second input pair, the first current mirror comprising a first MOS transistor in a diode-connected structure and a second MOS transistor having a common gate connection node with the first MOS transistor and one of the MOS transistor pair, and the second current mirror comprising a third MOS transistor in a diode-connected structure and a fourth MOS transistor having a common gate connection node with the third MOS transistor and the other of the MOS transistor pair.

11. The Miller-compensated amplifier of claim 1, wherein the third gain stage comprises:

fifth and sixth MOS transistors coupled to the third input pair;

a third current mirror coupled to the fifth and sixth MOS transistors;

a seventh MOS transistor having a gate coupled to one of the fifth and sixth MOS transistors, and having a source thereof connected to a voltage source; and a second current source providing a current to a drain of the seventh MOS transistor;

wherein a voltage at the drain of the seventh MOS transistor serves as the output voltage.

12. A Miller-compensated amplifier having an amplifier input pair and an amplifier output pair, comprising:

a first gain stage having the amplifier input pair as a first input pair, receiving an input voltage pair and a first output pair outputting a first current pair (i1 and i1');

a second gain stage having a second input pair receiving a second current pair (i2 and i2'), and having a second output pair outputting a third current pair (i3 and i3'), the second gain stage amplifying a small signal part of the second current pair by a first gain to form a small signal part of the third current pair and a DC component of the second current pair by a second gain to form a DC component of the third current pair;

a third gain stage having a third input pair receiving the third current pair (i3 and i3') and converting the third current pair (i3 and i3') to generate an output voltage pair at the amplifier output pair; and two capacitors respectively coupled between one of the amplifier output pair and a corresponding second gain stage input pair;

wherein one of the second current pair is a first sum of one of the first current pair and one of a fourth current pair (i2=i1+i4) and the other of the second current pair is a second sum of the other of the first current pair and the other of the fourth current pair (i2'=i1'+i4') wherein the fourth current pair is through the capacitors.

13. The Miller-compensated amplifier of claim 12, wherein the first gain exceeds one.

14. The Miller-compensated amplifier of claim 12, wherein the second gain substantially equals one.

15. The Miller-compensated amplifier of claim 12, wherein the second gain stage further comprises a current source pair coupled to the second input pair.

16. The Miller-compensated amplifier of claim 15, wherein the current source pair sources current from the second gain stage.

17. The Miller-compensated amplifier of claim 15, wherein the current source pair sinks current to the second gain stage.

18. The Miller-compensated amplifier of claim 12, wherein the second gain stage further comprises a MOS transistor pair with drains thereof cross-coupled to the second input pair.

19. The Miller-compensated amplifier of claim 12, wherein the first gain stage comprises:

a differential amplifier converting a voltage of the differential input signal to differential output currents at an output pair; and a first current source providing a bias current to the differential amplifier.

20. The Miller-compensated amplifier of claim 12, wherein the second gain stage comprises:

a current source pair coupled to the second input pair; and first and second current mirrors coupled to the second input pair, the first current mirror comprising a first MOS transistor in a diode-connected structure and a second MOS transistor having a common gate connection node with the first MOS transistor and one of the current source pair, and the second current mirror comprising a third MOS transistor in a diode-connected structure and a fourth MOS transistor having a common gate connection node with the third MOS transistor and the other of the current source pair.

21. The Miller-compensated amplifier of claim 12, wherein the second gain stage comprises:

a MOS transistor pair with drains thereof cross-coupled to the second input pair; and first and second current mirrors coupled to the second input pair, the first current mirror comprising a first MOS transistor in a diode-connected structure and a second MOS transistor having a common gate connection node with the first MOS transistor and one of the MOS transistor pair, and the second current mirror comprising a third MOS transistor in a diode-connected structure and a fourth MOS transistor having a common gate connection node with the third MOS transistor and the other of the MOS transistor pair.

22. The Miller-compensated amplifier of claim 12, wherein the third gain stage comprises:

fifth and sixth MOS transistors coupled to the third input pair;

second and third current sources respectively coupled to the fifth and sixth MOS transistors;

a seventh MOS transistor having a gate coupled to the sixth MOS transistors, and having a source thereof connected to a voltage source;

a fourth current source providing a current to a drain of the seventh MOS transistor;

a eighth MOS transistor having a gate coupled to the fifth MOS transistors, and having a source thereof connected to a voltage source; and a fifth current source providing a current to a drain of the eighth MOS transistor;

wherein voltages at the drains of the seventh and eighth MOS transistors serve as the output voltage pair.

* * * * *